United States Patent
Piatek et al.

(10) Patent No.: US 11,199,392 B2
(45) Date of Patent: Dec. 14, 2021

(54) METHOD FOR ESTIMATING VISIBILITY OF OBJECTS

(71) Applicant: APTIV TECHNOLOGIES LIMITED, St. Michael (BB)

(72) Inventors: Marcin Piatek, Cracow (PL); Kamil Lelowicz, Bogunice (PL)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 99 days.

(21) Appl. No.: 16/832,017

(22) Filed: Mar. 27, 2020

(65) Prior Publication Data
US 2020/0326174 A1 Oct. 15, 2020

(30) Foreign Application Priority Data
Apr. 11, 2019 (EP) .................................. 19168632

(51) Int. Cl.
*G01B 11/00* (2006.01)
*G01B 11/26* (2006.01)

(52) U.S. Cl.
CPC .......... *G01B 11/002* (2013.01); *G01B 11/26* (2013.01)

(58) Field of Classification Search
CPC .................................................. G01B 11/002
USPC ....................................................... 356/614
See application file for complete search history.

(56) References Cited

U.S. PATENT DOCUMENTS

| | | | | |
|---|---|---|---|---|
| 6,144,158 | A * | 11/2000 | Beam | F21S 41/143 315/82 |
| 9,558,584 | B1 * | 1/2017 | Lo | G05D 1/0238 |
| 2006/0244907 | A1 * | 11/2006 | Simmons | G02B 27/46 351/159.26 |
| 2014/0285429 | A1 * | 9/2014 | Simmons | H04N 1/00129 345/156 |
| 2016/0004795 | A1 * | 1/2016 | Novak | G06F 30/20 703/1 |

OTHER PUBLICATIONS

Anonymous; "Scratchpixel 2.0" Apr. 10, 2019; XP055640075, Retrieved from the internet URL:https://web.archive.org/web/20190410145020/http://www.scratchapixel.com/index.php.

Meibner, "Occlusion Culling and Hardware Accelerated Volume Rendering," Sep. 18, 2001, Universitat Tubingen, XP055639285.

(Continued)

*Primary Examiner* — Tarifur R Chowdhury
*Assistant Examiner* — Omar H Nixon
(74) *Attorney, Agent, or Firm* — Carlson, Gaskey & Olds

(57) ABSTRACT

A method of estimating whether an object is visible for a sensor includes determining a position and orientation of at least two objects, defining surfaces tangent to each object that cover the object, and defining a plurality of rays starting at a sensor position specifying an origin of a coordinate system. Each ray has an azimuth and elevation angle in the coordinate system. For each object, a respective subset of rays have a point of intersection with at least one of the surfaces of the object. For each ray of the subset, the object comprising the point of intersection having the shortest distance to the origin of the coordinate system is identified, and a visibility index for the identified object is increased. A percentage of visibility for each object is determined as a ratio of the visibility index and the number of rays of the subset of the object.

14 Claims, 6 Drawing Sheets

(56) References Cited

OTHER PUBLICATIONS

Anonymous: "Digital camera-Wikipedia" Apr. 10, 2019, pp. 1-20, XP055639964 Retrieved from the Internet: URL:https://en.wikipedia.org/w/index/php?title=Digital_camera&oldid=891857923.
Scholer et al; "Person tracking in three-dimensional laser range data with expllicit occlusion adaption", Robotics and Automation (ICRA), 2011 IEEE International Conference On, IEEE, May 9, 2011, pp. 1297-1303, XP032017519, DOI: 10.1109/ICRA.2011.5979984; ISBN: 978-1-61284-386-5.
Extended European Search Report for Application No. EP 19 16 8632 dated Dec. 3, 2019.

* cited by examiner

METHOD FOR ESTIMATING VISIBILITY OF OBJECTS

CROSS-REFERENCE TO RELATED APPLICATION

This application claims priority to European Patent Application No. 19168632.8, filed on Apr. 11, 2019.

FIELD

The present disclosure relates to a method for estimating whether an object is visible for a sensor.

BACKGROUND

In automotive applications, sensor models are widely used for design and validation processes. The sensor models are implemented as algorithms in order to predict an expected performance of a sensor with respect to certain physical properties.

One group of these algorithms simulates the perception performance of a 3D sensor. The perception performance can be detected, for example, by examining whether a certain object is visible for the sensor. An object can be regarded as visible for the sensor if a predetermined part of a projection of the object is located within a field of view of the sensor and is not covered by any other object. However, such algorithms can be time-consuming if a high accuracy is required for analyzing the perception of the sensor. Therefore, a high computational speed is necessary if such an algorithm is to be used in real time simulations.

Accordingly, there is a need to provide a method which estimates whether an object is visible for a sensor and which can be implemented by an algorithm requiring a low computational effort.

SUMMARY

In one aspect, the present disclosure is directed at a computer implemented method for estimating whether an object is visible for a sensor. According to the method, a position and an orientation of at least two objects are determined, and surfaces are defined which are tangent to the respective object and which cover the respective object. A plurality of rays is defined starting at a predefined sensor position which specifies an origin of a three-dimensional coordinate system. Each ray has an azimuth angle and an elevation angle with respect to the coordinate system and a difference of respective azimuth and elevation angles of each pair of adjacent rays is constant. In addition, the plurality of rays covers a region in which the at least two objects are located. For each object, a respective subset of rays is identified which have a point of intersection with at least one of the surfaces of the respective object, and a number of rays of the subset is determined. A respective visibility index is associated to each object, and each visibility index is initialized with zero. For each ray of the subsets, the object comprising the point of intersection having the shortest distance to the origin of the coordinate system is identified, and the visibility index for the identified object is increased by one. A percentage of visibility for each object is determined as a ratio of the visibility index associated to the respective object and the number of rays of the subset of the same object.

According to the method, the percentage of visibility is determined for each object just by the ratio of two numbers. The first of these numbers results from counting, for each object, the rays comprising a point of intersection which has the shortest distance to the sensor for this ray, whereas the second number is the total number of rays having at least one point of intersection with the same object. Due to using just two numbers for the determination of the percentage of visibility, a low computational effort is required for the method.

The difference of azimuth angles and the difference of elevation angles of pairs of adjacent rays may be regarded as two different parameters having respective constant values which may be different from each other. Alternatively, however, the constant difference of azimuth angles and the constant difference of elevation angles may be identical for pairs of adjacent rays. In addition, the difference of azimuth angles and the difference of elevation angles of pairs of adjacent rays define a density of rays in horizontal and vertical direction, respectively.

The method may further comprise one or more of the following features. A projection area may be determined for each object by identifying a minimum azimuth angle, a maximum azimuth angle, a minimum elevation angle and a maximum elevation angle of the object with respect to the coordinate system, wherein a group of rays which have a point of intersection with the projection area of the object may be preselected from the plurality of rays, and wherein the respective subset of rays having a point of intersection with at least one of the surfaces of the object may be identified for the preselected group of rays only. For each object, an oriented bounding box may be defined enclosing the respective object completely, wherein surfaces of the oriented bounding box may replace the surfaces of the object in identifying a respective subset of rays which have a point of intersection. Each surface of the oriented bounding box may comprise a center of area, a width and a length. Identifying a respective subset of rays which have a point of intersection with at least one of the surfaces of the oriented bounding box may comprise determining the point of intersection of each ray and one of the surfaces of the oriented bounding box by i) defining a Cartesian coordinate system at the center of area of the surface such that the surface is located in a XY-plane of the Cartesian coordinate system, ii) determining a position where the ray intersects the XY-plane, and iii) identifying the ray as a ray of the subset of the respective oriented bounding box if the position falls within limits defined by the width and the length of the surface of the oriented bounding box. The projection area of the object may be determined by a minimum azimuth angle, a maximum azimuth angle, a minimum elevation angle and a maximum elevation angle of all corners of the oriented bounding box of the object. The region being covered by the of the plurality of rays may be defined by a minimum azimuth angle, a maximum azimuth angle, a minimum elevation angle and a maximum elevation angle with respect to all projection areas of the at least two objects. The sensor may be an optical or optoelectronic sensor comprising at least one focusing element and a detection device, and the focusing element may have a focal point which may correspond to the predefined sensor position. The sensor may further comprise a light source which illuminates a field of view of the sensor, and the field of view of the sensor may comprise the region in which the at least two objects are located. In addition, the sensor may comprise a processing device which receives signals from the detection device and creates at least one image of the at least two objects. The constant difference of respective azimuth and elevation angles of each pair of adjacent rays may be determined based on a resolution of the sensor. The resolution of the sensor may be determined by measuring a minimum size of a reference object which the sensor is able to detect at a maximum range and by calculating a ratio of the minimum size to the maximum range, and the resolution of the sensor may define an upper limit for the constant difference of respective azimuth and elevation angles of each pair of adjacent rays. It may be determined that a respective one of the at least two objects is visible for the sensor if the percentage of visibility being determined for the respective object is greater than a predetermined threshold.

A projection area may be determined for each object by identifying a minimum azimuth angle, a maximum azimuth angle, a minimum elevation angle and a maximum elevation angle of the object with respect to the coordinate system, and a group of rays having a point of intersection with the projection area of the object may be preselected from the plurality of rays. Identifying the respective subset of rays having a point of intersection with at least one of the surfaces of the object may be performed for the preselected group of rays only. Preselecting the group of rays from the plurality of rays may be performed by comparing the respective azimuth and elevation angles of each ray with the minimum and maximum azimuth and elevation angles of the projection area. Thus, rays being not relevant for the respective object can be easily excluded from consideration since they are located outside the projection area of this object. Due to the preselection of relevant rays the computational effort of the method is reduced.

According to an embodiment of the method, for each object an oriented bounding box is defined which encloses the respective object completely, and surfaces of the oriented bounding box replace the surfaces of the object in identifying a respective subset of rays which have a point of intersection. The oriented bounding box may have the same geometrical center as the object. In addition, its size may be defined by a length, a width and a height, and its orientation may be defined by a roll angle, a pitch angle and a yaw angle with respect to the coordinate system.

Since the oriented bounding box having right angles and straight surfaces replaces the original object which may comprise complicated curvilinear surfaces, the identification of points of intersection with the rays is simplified for this embodiment. Therefore, the computational effort for performing the method is reduced again.

Each surface of the oriented bounding box may comprise a center of area, a width and a length. Identifying a respective subset of rays which have a point of intersection with at least one of the surfaces of the oriented bounding box may comprise determining the point of intersection of each ray and one of the surfaces of the oriented bounding box by i) defining a Cartesian coordinate system at the center of area of the surface such that the surface is located in an XY-plane of the Cartesian coordinate system, ii) determining a position where a ray intersects the XY-plane, and iii) identifying the ray as a ray of the subset of the respective oriented bounding box if the position falls within limits defined by the width and the length of the surface of the oriented bounding box. Due to this representation of the surface of the oriented bounding box in the XY-plane of the Cartesian coordinate system the identification of a point of intersection between a ray and the surface is facilitated which speeds up the execution of the method.

The projection area of the object may be determined by a minimum azimuth angle, a maximum azimuth angle, a minimum elevation angle and a maximum elevation angle of all corners of the oriented bounding box of the object. Since the positions of the corners of the oriented bounding box have to be considered only instead of the geometry of the original object which may be complicated, the determination of the projection area may be simplified for this embodiment, and the performance of the method is enhanced.

The region being covered by the plurality of rays may be defined by a minimum azimuth angle, a maximum azimuth angle, a minimum elevation angle and a maximum elevation angle with respect to all projection areas of the at least two objects. Therefore, the region being covered by the plurality of rays may be restricted to the region where the at least two objects are actually located in space. Thus, the number of rays within the plurality of rays is reduced which again reduces the computational effort for the method.

The sensor may be an optical or optoelectronic sensor comprising at least one focusing element and a detection device, e.g. a CCD or CMOS device. The focusing element may have a focal point which may correspond to the predefined sensor position. The sensor may further comprise a light source like a LED or a laser system which illuminates a field of view of the sensor, and the field of view of the sensor may comprise the region in which the at least two objects are located. In addition, the sensor may comprise a processing device which receives signals from the detection device and creates at least one image of the at least two objects.

The constant difference of respective azimuth and elevation angles of each pair of adjacent rays may be determined based on a resolution of the sensor. The resolution of the sensor may be determined by a minimum size of a reference object which can be detected by the sensor at a maximum range of the sensor. The ratio of the minimum size to the maximum range may define an upper limit for the constant difference of respective azimuth and elevation angles of each pair of adjacent rays. Therefore, the accuracy for estimating the visibility of the at least two objects can be adapted to the accuracy of the sensor which is given by its spatial resolution.

A respective one of the at least two objects may be regarded as visible for the sensor if the percentage of visibility being determined for the respective object is greater than a predetermined threshold, e.g. 70%.

In another aspect, the present disclosure is directed at a computer system which is configured to carry out several or all steps of the computer implemented methods described herein.

The computer system may comprise a processing unit, at least one memory unit and at least one non-transitory data storage. The non-transitory data storage and/or the memory unit may comprise a computer program for instructing the computer to perform several or all steps or aspects of the computer implemented method described herein.

In still another aspect, the present disclosure is directed at a non-transitory computer readable medium comprising instructions for carrying out several or all steps or aspects of the computer implemented methods described herein.

In another aspect, the present disclosure is directed at a non-transitory computer readable medium comprising instructions for carrying out several or all steps or aspects of the computer implemented method described herein. The computer readable medium may be configured as: an optical medium, such as a compact disc (CD) or a digital versatile disk (DVD); a magnetic medium, such as a hard disk drive (HDD); a solid state drive (SSD); a read only memory (ROM), such as a flash memory; or the like. Furthermore, the computer readable medium may be configured as a data storage that is accessible via a data connection, such as an internet connection. The computer readable medium may, for example, be an online data repository or a cloud storage.

The present disclosure is also directed at a computer program for instructing a computer to perform several or all steps or aspects of the computer implemented method described herein.

BRIEF DESCRIPTION OF THE DRAWINGS

Exemplary embodiments and functions of the present disclosure are described herein in conjunction with the following drawings, in which.

DETAILED DESCRIPTION

Figure 1:
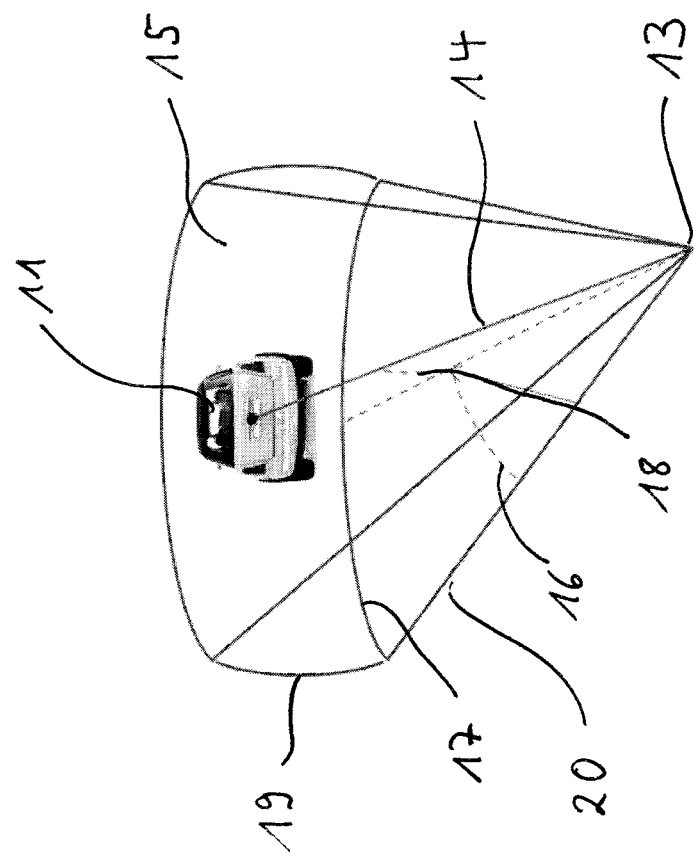
FIG. 1 depicts a field of view of a sensor comprising an object.

In FIG. 1, a vehicle is shown as an example of an object 11 which is to be monitored by a sensor located at a sensor position 13. Monitoring of the object 11 may be a part of an automotive application, e.g. adaptive cruise control or collision avoidance, if the sensor is installed at a host vehicle (not shown).

The sensor may be any optical or optoelectronic sensor comprising at least one focusing element, e.g. one or more lenses and/or mirrors, and a detection device, e.g. a CCD or CMOS device. The focusing element has a focal point which may correspond to the sensor position 13. The sensor may further comprise a light source like a LED or a laser system which illuminates a field of view 15 of the sensor. In addition, the sensor may comprise a processing device which receives signals from the detection device and creates at least one image of the object 11.

The object 11 is located within the field of view 15 of the sensor. The field of view 15 may be described by a total azimuth angle 17 and a total elevation angle 19. The object 11 is visible for the sensor only if it is located within the field of view 15 of the sensor. A location of a center of the object 11 may be described by a distance 14, an azimuth angle 16 and an elevation angle 18 with respect to the sensor position 13. That is, the sensor position 13 defines an origin of a three-dimensional coordinate system comprising e.g. the distance to the sensor position 13 as well as the azimuth and elevation angles as coordinates which are defined with respect to a polar axis 20.

Figure 2:
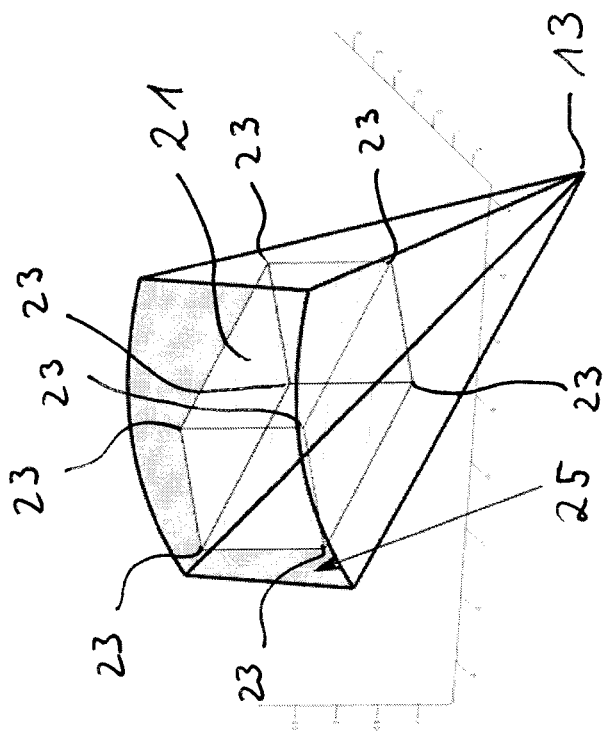
FIG. 2 depicts an oriented bounding box and its projection area.

In FIG. 2, an oriented bounding box 21 is depicted which may enclose the object 11 to be monitored by the sensor or which may be the object 11 to be monitored itself. The oriented bounding box 21 is a cuboid having eight corners 23. The position of the eight corners 23 defines the position, the size and the orientation of the oriented bounding box 21 in space, i.e. with respect to the sensor position 13. That is, the size of the oriented bounding box 21, i.e. its length, width and height, its orientation angles, i.e. roll, pitch and yaw, and the position of its center are known if the positions of its eight corners 23 are given.

Furthermore, by the position of the corners 23 of the oriented bounding box 21 a projection area 25 of the oriented bounding box 21 may be defined with respect to the sensor position 13. The projection area 25 may be determined by minimum and maximum azimuth angles as well as minimum and maximum elevation angles with respect to all eight corners 23 of the oriented bounding box 21. In addition, surfaces of the oriented bounding box 21 may be described in the coordinate system having the origin at the sensor position 13 by a position of a center of area, a width and a length of every surface of the oriented bounding box 21.

Figure 3:
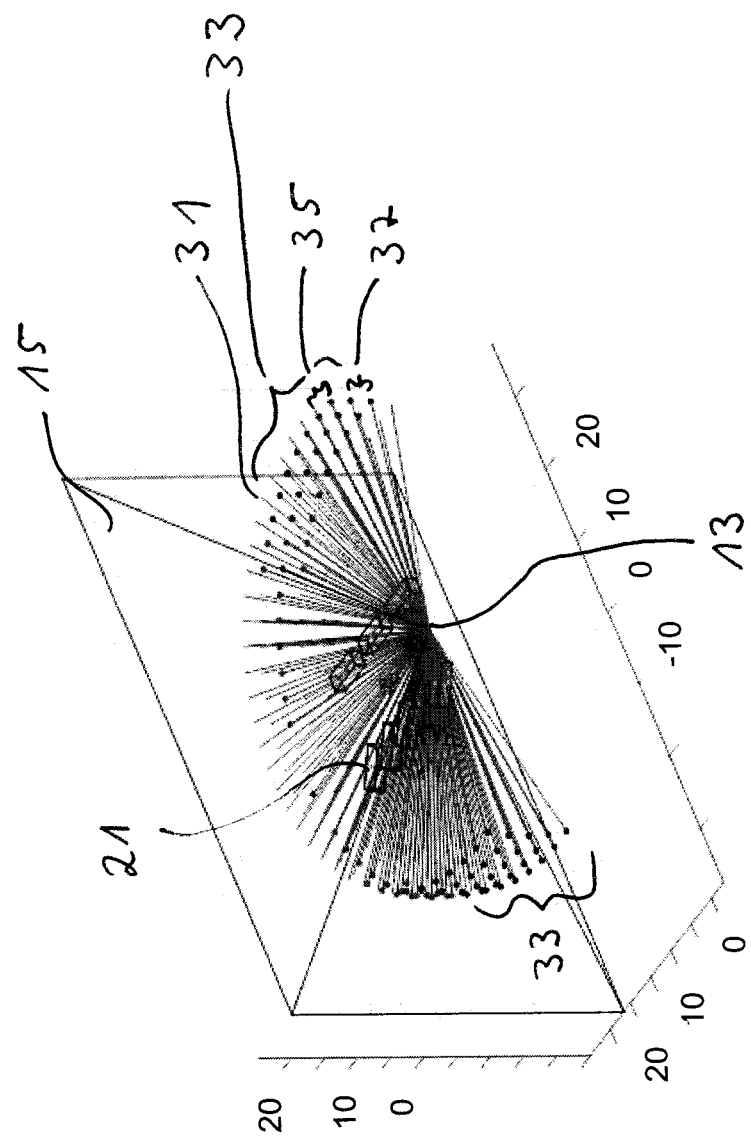
FIG. 3 depicts a plurality of rays within the field of view of the sensor.

FIG. 3 depicts the field of view 15 of the sensor with respect to the sensor position 13 (see also FIG. 1) which is the starting point for a plurality of rays 31. The rays 31 do not cover the entire field of view 15 of the sensor, but they are defined for a region only in which an arrangement of the oriented bounding boxes 21 exists.

In detail, the region in which the rays 31 are defined is restricted by boundary angles which are given by the projection areas 25 considered for all oriented bounding boxes 21. The boundary angles are defined as the lowest azimuth angle and the highest azimuth angle as well as the lowest elevation angle and the highest elevation angle being determined for all projection areas 25 of the oriented bounding boxes 21.

The plurality of rays 31 which are used for estimating the visibility of objects by the sensor as described below are therefore restricted to a region where they pass through at least one surface of the oriented bounding boxes 21. In contrast, the rays denoted by 33 are excluded from the relevant plurality of rays 31 since these rays 33 do not pass through any surface of the oriented bounding boxes 21.

In addition, the difference of angles between neighboring or adjacent rays 31 is constant within the plurality of rays 31. That is, a difference 35 of respective azimuth angles and a difference 37 of respective elevation angles is constant within the plurality for each pair of adjacent rays 31. That is, on a sphere being centered at the sensor position 13, adjacent rays 31 intersect at points having a constant distance on the sphere surface. In other words, the points of intersection of the rays 31 on such a sphere surrounding the sensor position 13 form an equidistant grid on this sphere.

The density of the rays 31 depends on the sensor resolution or sensor accuracy. For example, if the sensor is able to resolve objects having a height h=1 m and a width w=1 m at a distance I=100 m, an upper limit for the difference 35 of the azimuth angles denoted by $\Delta\alpha$ and an upper limit for the difference 37 of the elevation angles denoted by $\Delta\theta$ are defined for four neighboring rays 31 as:

$$\Delta\alpha = \arctan\left(\frac{w}{l}\right) = \arctan\left(\frac{1}{100}\right) = 0.01$$

$$\Delta\theta = \arctan\left(\frac{h}{l}\right) = \arctan\left(\frac{1}{100}\right) = 0.01$$

That is, the difference 35 of the azimuth angles and the difference 37 of the elevation angles for four neighboring rays 31 should not be greater than 0.01 for the present example.

Figure 4:
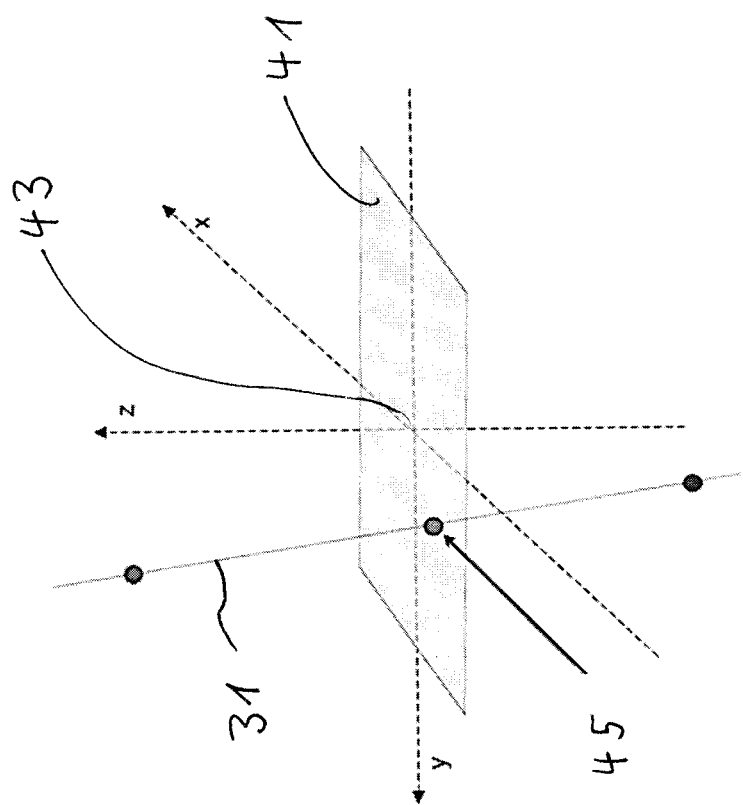
FIG. 4 depicts a surface of an oriented bounding box and a point of intersection between the surface and a ray.

For each ray 31 of the plurality of rays 31 as defined above in context with FIG. 3, points 45 of intersection (see FIG. 4) are calculated with every surface 41 of every oriented bounding box 21. Since the calculation of points of intersection is time-consuming, a specific ray 31 is checked first regarding an intersection with the projection area 25 of the oriented bounding box 21 under consideration. For this check, the azimuth and elevation angles of the specific ray 31 are compared with the respective lowest and highest azimuth and elevation angles which limit the projection area 25 of the oriented bounding box 21 under consideration. If the azimuth and elevation angles of the specific ray 31 do not fall within the limits defined by the lowest and highest azimuth and elevation angles of the projection area 25 of the oriented bounding box 21, it is assumed that there is no point of intersection for the specific ray 31 with the oriented bounding box 21 under consideration.

The rays 31 having azimuth and elevation angles within the limits as defined by the projection area 25 of the oriented box 21 under consideration form a preselected group of rays 31 for which a point of intersection with at least one of the surfaces 41 of the oriented bounding box 21 is expected. Therefore, the further calculation steps as described below are performed for the rays 31 of the preselected group only with respect to the oriented bounding box 21 under consideration.

For each ray 31 falling within the limits of the projection area 25 of a respective oriented bounding box 21, it is determined if there is a point of intersection 45 with one of the surfaces 41 of the oriented bounding box 21 as follows. First, a Cartesian coordinate system is defined having its origin at a center of area 43 of the surface 41 (see FIG. 4) and having an orientation of its axes such that the surface 41 is located in the XY-plane. A respective ray 31 is transformed to the Cartesian coordinate system of the surface 41.

Next, a position is calculated where the ray 31 intersects the XY-plane. Thereafter, it is determined if this position of intersection with the XY-plane falls within limits defined by the length and the width of the surface 41. If yes, there is a point of intersection 45 for the specific ray 41 and the specific surface 41, and the coordinates of this point of intersection 45 are transformed back to the sensor coordinate system for the subsequent steps for estimating visibility of the oriented bounding boxes 21.

For each oriented bounding box 21, a first counter is defined which is initialized with zero and incremented by one for every ray 31 which has a point of intersection 45 with at least one surface 41 of the respective oriented bounding box 21. In other words, a subset of the plurality of rays 31 is identified having a point of intersection 45 with at least one surface 41 of the oriented bounding box 21, and the first counter counts the total number of rays 31 of the subset. The number of rays 31 counted by the first counter is proportional to a total area of projection of the oriented bounding box 21 within the field of view 15 of the sensor.

When all points of intersection 45 for a specific ray 31 are determined, i.e. for all possible oriented bounding boxes 21, the point of intersection 45 having the shortest distance with respect to the sensor position 13 (see FIGS. 1, 2 and 3) is determined for the specific ray 31. This point of intersection 45 having the shortest distance to the sensor position 13 for the specific ray 31 may also be denoted as visible point of intersection since it is not concealed for the sensor by any other surface 41 of the same or another oriented bounding box 21.

For each oriented bounding box 21, a second counter is defined which is initialized with zero and incremented for each visible point of intersection which is located on one of the surfaces 41 of this oriented bounding box 21.

The number counted by the second counter of a respective oriented bounding box 21 may also be regarded as a visibility index for this oriented bounding box 21. For each ray 31 having at least one point of intersection 45 with any surface 41 of one of the oriented bounding boxes 21, the second counter or visibility index is increased by one for a respective object if this object is identified as comprising a visible point of intersection for the specific ray 31, i.e. having the shortest distance to the sensor position 13 for this ray 31. The number counted by the second counter or the visibility index is proportional to the area of projection which is not concealed by other oriented bounding boxes 21 and therefore visible for the sensor.

When all rays 31 of the plurality of rays 31 (see FIG. 3) are checked for points of intersection 45 having the shortest distance to the sensor position 13, a percentage of visibility for respective object is defined as a ratio of the visibility index (final number of the second counter) for the respective object and the total number of rays 31 having at least one point of intersection 45 with the same object wherein the last number is determined by the first counter:

percentage of visibility=number of visible points of intersection for an object/total number of rays intersecting the object.

A specific oriented bounding box 21 may be regarded as visible for the sensor if the percentage of visibility is greater than a predefined threshold, e.g. 70%.

Figure 5:
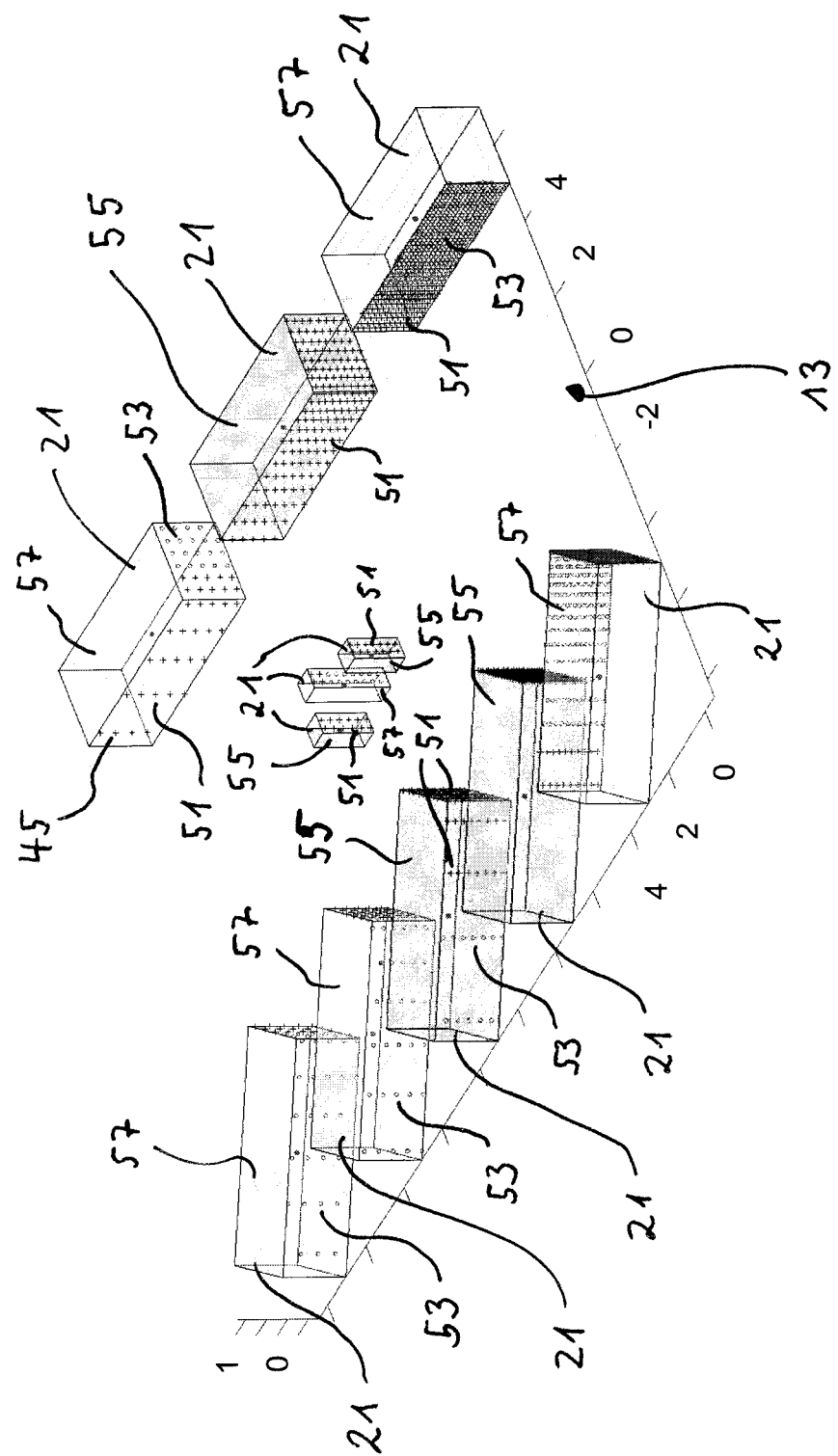
FIG. 5 depicts a result of a method according to the disclosure, comprising oriented bounding boxes being visible and oriented bounding boxes being not visible.
Figure 6:
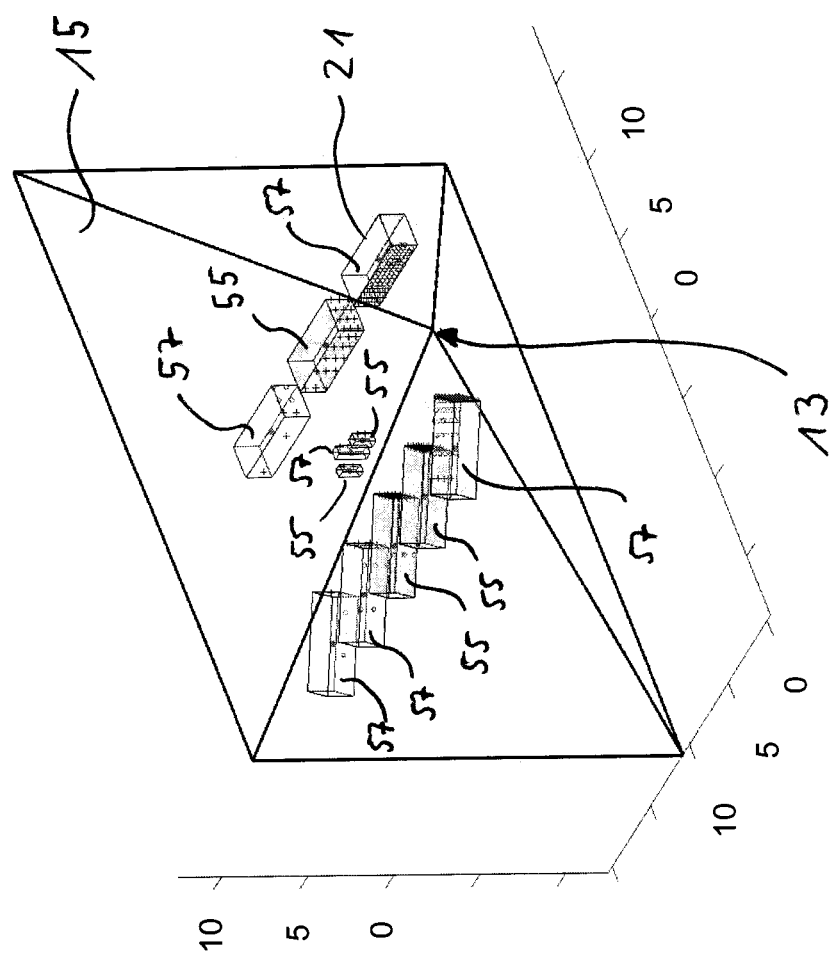
FIG. 6 depicts the result of the method as shown in FIG. 5 including the field of view of the sensor.

In FIG. 5 a result of the method according to the disclosure is depicted. Within the field of view 15 of a sensor located at the sensor position 13 being the origin of the sensor coordinate system, a plurality of oriented bounding boxes 21 is arranged. The oriented bounding boxes 21 shown in FIG. 5 differ with respect to location, orientation and size. In FIG. 6, the arrangement of oriented bounding boxes 21 is depicted again together with the sensor position 13 and the field of view 15 of the sensor for better orientation.

For each of the oriented bounding boxes 21, points of intersection 45 are shown as rows of crosses and circles. Each cross or circle corresponds to a ray 31 as shown in FIG. 3 and having an intersection with at least one surface of one of the oriented bounding boxes 21.

The plurality of points of intersection 45 consists of two groups: the first group comprises points 51 which are depicted as crosses and which are visible for the sensor since these points of intersection 51 have the shortest distance to the sensor position 13 for the specific ray 31, whereas the second group consists of points 53 which are depicted as circles and which are not visible for the sensor since there is another point of intersection belonging to the same ray 31 which is located closer to the sensor position 13 than the point 53 under consideration.

For each of the oriented bounding boxes 21, the number of visible points of intersection 51 is counted which number is denoted as visibility index for the specific oriented bounding box 21. In addition, the number of rays 31 which have an intersection with at least one surface of the specific oriented bounding box 21 is counted for each oriented bounding box 21. This number corresponds to the total number of crosses and circles shown in FIG. 5 for each oriented bounding box 21, i.e. the sum of the number of visible points 51 (crosses) and the number of points 53 (circles) being not visible for the sensor for the specific oriented bounding box 21. For sake of clarity, those points of intersection 45 are shown in FIG. 5 only for which a ray 31 encounters the respective oriented bounding box 21 for the first time, i.e. points of intersection 45 at the rear surfaces of the oriented bounding boxes 21 are omitted.

After the number of visible points 51 and the number of rays 31 having an intersection with at least one surface are determined for each oriented bounding box 21, the percentage of visibility is calculated for each oriented bounding box 21 as the ratio of these numbers. If the percentage of visibility is greater than the threshold of e.g. 70%, the specific oriented bounding box 21 is regarded as visible for the sensor. Accordingly, visible boxes 55 and boxes 57 being not visible can be distinguished in FIGS. 5 and 6, wherein the visible boxes 55 are highlighted by grey color. Please note that for the two boxes 21 being closest to the sensor position 13, most of the rays 31 are outside the field of view 15 of the sensor and have therefore points of intersection 53 with the corresponding oriented bounding boxes 21 which are not visible for the sensor.

The steps for estimating the percentage of visibility of oriented bounding boxes 21 as described above may be implemented as an algorithm or computer implemented method on a computer system which is configured to carry out the algorithm or computer implemented method. Furthermore, a non-transitory computer readable medium may comprise instructions for carrying out the algorithm or computer implemented method. Due to the use of two counters only for each oriented bounding box 21 and due to the special selection of relevant rays 31 as described above, an algorithm can be achieved which requires a low computational effort and is running at high speed.

We claim:

1. A computer implemented method for estimating whether an object is visible for a sensor, the method comprising:
    determining a position and an orientation of at least two objects,
    for each object, defining respective surfaces which are tangent to the object and which cover the object,
    defining a plurality of rays starting at a predefined sensor position specifying an origin of a three-dimensional coordinate system,
        wherein each ray has an azimuth angle and an elevation angle with respect to the coordinate system, and
        wherein a difference of respective azimuth and elevation angles of each pair of adjacent rays is constant,
        wherein the plurality of rays covers a region in which the at least two objects are located,
    for each object, identifying a respective subset of rays which have a point of intersection with at least one of the surfaces of the object and determining a number of rays of the subset,
    associating a respective visibility index to each object and initializing each visibility index with zero,
    for each ray of the subsets, identifying the object comprising the point of intersection having the shortest distance to the origin of the coordinate system and increasing the visibility index for the identified object by one, and
    for each object, determining a percentage of visibility for the object as a ratio of the visibility index associated to the object and the number of rays of the subset of the object.

2. The method according to claim 1, comprising:
    determining a projection area for each object by identifying a minimum azimuth angle, a maximum azimuth angle, a minimum elevation angle and a maximum elevation angle of the object with respect to the coordinate system,
    preselecting a group of rays having a point of intersection with the projection area of the object from the plurality of rays, and
    identifying the respective subset of rays having a point of intersection with at least one of the surfaces of the object for the preselected group of rays only.

3. The method according to claim 2,
wherein the projection area of the object is determined by a minimum azimuth angle, a maximum azimuth angle, a minimum elevation angle and a maximum elevation angle of all corners of the oriented bounding box of the object.

4. The method according to claim 2,
wherein the region being covered by the plurality of rays is defined by a minimum azimuth angle, a maximum azimuth angle, a minimum elevation angle and a maximum elevation angle with respect to all projection areas of the at least two objects.

5. The method according to claim 1, comprising:
for each object, defining an oriented bounding box enclosing the respective object completely,
wherein surfaces of the oriented bounding box replace the surfaces of the object in identifying a respective subset of rays which have a point of intersection.

6. The method according to claim 5,
wherein each surface of the oriented bounding box comprises a center of area, a width and a length, and
wherein identifying a respective subset of rays which have a point of intersection with at least one of the surfaces of the oriented bounding box comprises determining the point of intersection of each ray and one of the surfaces of the oriented bounding box by:
    defining a Cartesian coordinate system at the center of area of the surface such that the surface is located in an XY-plane of the Cartesian coordinate system,
    determining a position where the ray intersects the XY-plane, and
    if the position falls within limits defined by the width and the length of the surface of the oriented bounding box, identifying the ray as a ray of the subset of the oriented bounding box.

7. The method according to claim 1,
wherein the sensor is an optical or optoelectronic sensor comprising at least one focusing element and a detection device, and
wherein the focusing element has a focal point which corresponds to the predefined sensor position.

8. The method according to claim 7,
wherein the sensor comprises a light source which illuminates a field of view of the sensor, and
wherein the field of view of the sensor comprises the region in which the at least two objects are located.

9. The method according to claim 7,
wherein the sensor comprises a processing device which receives signals from the detection device and creates at least one image of the at least two objects.

10. The method according to claim 1,
wherein the difference of respective azimuth and elevation angles of each pair of adjacent rays is determined based on a resolution of the sensor.

11. The method according to claim 10,
wherein the resolution of the sensor is determined by measuring a minimum size of a reference object which the sensor is able to detect at a maximum range and by calculating a ratio of the minimum size to the maximum range, and wherein the resolution of the sensor defines an upper limit for the constant difference of respective azimuth and elevation angles of each pair of adjacent rays.

12. The method according to claim 1, comprising determining that one of the at least two objects is visible for the sensor if the percentage of visibility being determined for the one of the at least two objects is greater than a predetermined threshold.

13. A computer system configured to carry out the computer implemented method of claim 1.

14. A non-transitory computer readable medium comprising instructions for carrying out the computer implemented method of claim 1.

* * * * *